(12) United States Patent
Lessard

(10) Patent No.: US 9,391,254 B2
(45) Date of Patent: Jul. 12, 2016

(54) ELECTRIC POWER GENERATION

(76) Inventor: Daniel Lessard, Bridgeport, CT (US)

( * ) Notice: Subject to any disclaimer, the term of this patent is extended or adjusted under 35 U.S.C. 154(b) by 559 days.

(21) Appl. No.: 13/534,367

(22) Filed: Jun. 27, 2012

(65) Prior Publication Data

US 2014/0000668 A1    Jan. 2, 2014

(51) Int. Cl.
| | | |
|---|---|---|
| *H01L 35/30* | (2006.01) | |
| *H02K 7/18* | (2006.01) | |
| *F01K 7/44* | (2006.01) | |
| *F01K 7/04* | (2006.01) | |
| *F01K 17/04* | (2006.01) | |

(52) U.S. Cl.
CPC . *H01L 35/30* (2013.01); *F01K 7/44* (2013.01); *F01K 17/04* (2013.01); *H02K 7/1823* (2013.01); *F23M 2900/13003* (2013.01); *Y02E 20/14* (2013.01); *Y02E 20/16* (2013.01); *Y02E 20/18* (2013.01)

(58) Field of Classification Search
CPC combination set(s) only.
See application file for complete search history.

(56) References Cited

U.S. PATENT DOCUMENTS

| | | | |
|---|---|---|---|
| 4,425,762 A | | 1/1984 | Wakamatsu |
| 5,794,446 A | | 8/1998 | Earley |
| 6,269,645 B1 * | | 8/2001 | Yamaguchi ............... 60/653 |
| 2009/0125152 A1 * | 5/2009 | Skowronski et al. ......... 700/281 |
| 2009/0241860 A1 * | 10/2009 | Monacelli et al. ............ 122/7 R |
| 2014/0060047 A1 * | 3/2014 | Kim ........................ F01K 7/22 60/645 |

FOREIGN PATENT DOCUMENTS

| | | |
|---|---|---|
| JP | 1994129211 A | 5/1994 |
| JP | 2008291793 A | 12/2008 |
| WO | 9855335 | 12/1998 |

OTHER PUBLICATIONS

Thermodynamics eBook: Ideal Rankine Cycle, http://www.ecourses.ou.edu/cgi-bin/ebook.cgi?doc=&topic=th . . . , 3 pages, downloaded Jun. 13, 2012.

* cited by examiner

*Primary Examiner* — Jeffrey T Barton
*Assistant Examiner* — Eric R Smith

(57) ABSTRACT

Apparatus for electric power generation. A system includes a boiler for heating a fluid, the boiler directing a first portion of the heated fluid to a turbine for the generation of electric power and a second portion of the heated fluid to a thermoelectric (TE) generator, and a condenser connected to the turbine that condenses hot fluid emitted from the turbine and feeds the condensed fluid to the TE generator, the TE generator generating electric power from a difference in temperature of the second portion of the heated fluid and the condensed fluid from the turbine.

21 Claims, 5 Drawing Sheets

ELECTRIC POWER GENERATION

BACKGROUND OF THE INVENTION

The invention generally relates to the generation of energy, and more specifically to electric power generation.

In general, electricity is produced at an electric power plant. Some fuel source, such as coal, oil, natural gas, or nuclear energy produces heat. The heat is used to boil water to create steam. The steam under high pressure is used to spin a turbine. The spinning turbine interacts with a system of magnets to produce electricity. The electricity is transmitted as moving electrons through a series of wires to homes and business.

A by-product of electrical power generation is heat. The efficiency of any system that generates heat as a by-product can be greatly improved by recovering or reducing the energy lost as heat.

SUMMARY OF THE INVENTION

The following presents a simplified summary of the innovation in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention provides methods and apparatus for electric power generation.

In general, in one aspect, the invention features a system including a boiler for heating a fluid, the boiler directing a first portion of the heated fluid to a turbine for the generation of electric power and a second portion of the heated fluid to a thermoelectric (TE) generator, and a condenser connected to the turbine that condenses hot fluid emitted from the turbine and feeds the condensed fluid to the TE generator, the TE generator generating electric power from a difference in temperature of the second portion of the heated fluid and the condensed fluid from the turbine.

In another aspect, the invention features a system including a feed water pump, a line linking the feed water pump to a boiler, the boiler heating cold fluid from the feed water pump to produce hot fluid, a line linking the boiler to a turbine and a feed water reheater, the line providing a first portion of the hot fluid from the boiler to the turbine and a second portion of the hot fluid from the boiler to the feed water reheater, and a first thermoelectric (TE) unit for receiving hot fluid from the feed water reheater and condensate from the condenser, the first TE unit generating electric power from a difference between a temperature of the hot fluid from the feed water reheater and the temperature of the condensate from the condenser.

In still another aspect, the invention features a method including, in a system including a boiler linked to a turbine, enabling a thermoelectric (TE) generator to receive a boiler generated hot fluid from the boiler and a turbine and condenser generated cold fluid from the turbine and a condenser and generate electric power from a difference between a temperature of the boiler generated hot fluid and a temperature of the turbine generated cold fluid.

In still another aspect, the invention features a method including, in a power generation system, extracting high temperature fluid from a heat exchanger, extracting cold feed water before it is reheated and pumped into the heat exchanger, generating electrical power from a difference in a temperature of the extracted high temperature fluid and a temperature of the extracted cold feed water in a thermoelectric (TE) generator, capturing any thermal energy discharged by the TE generator, and sending the thermal energy back to the heat exchanger.

Other features and advantages of the invention are apparent from the following description, and from the claims.

BRIEF DESCRIPTION OF THE DRAWINGS

The invention will be more fully understood by reference to the detailed description, in conjunction with the following figures, wherein.

DETAILED DESCRIPTION

Figure 1:
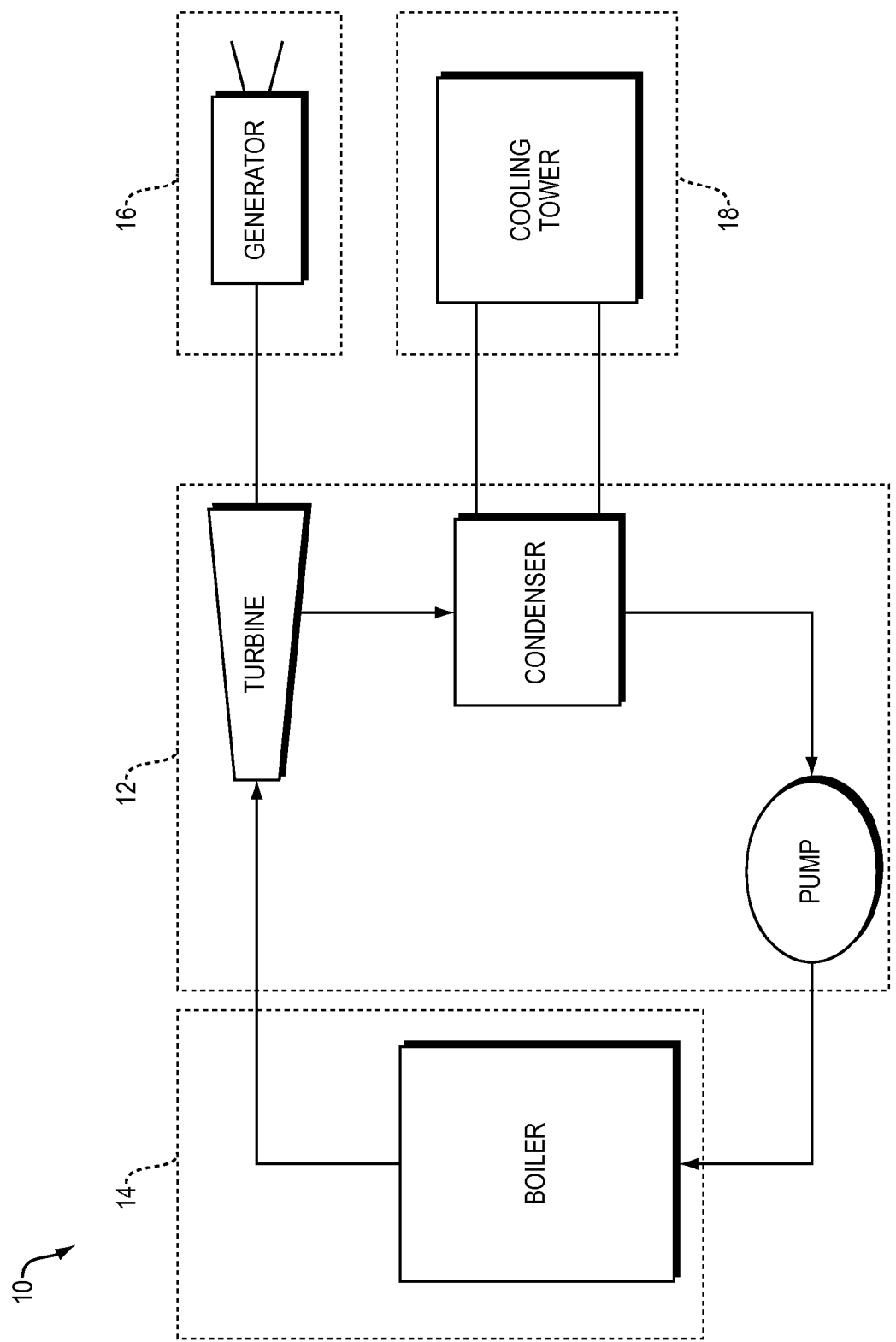
FIG. 1 is a block diagram of an exemplary power generation system.

The subject innovation is now described with reference to the drawings, wherein like reference numerals are used to refer to like elements throughout. In the following description, for purposes of explanation, numerous specific details are set forth in order to provide a thorough understanding of the present invention. It may be evident, however, that the present invention may be practiced without these specific details. In other instances, well-known structures and devices are shown in block diagram form in order to facilitate describing the present invention.

As used herein, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form.

In general, thermodynamic cycles can be divided into two general categories, i.e., power cycles, which produce a net power output, and refrigeration and heat pump cycles, which consume a net power input. Furthermore, thermodynamic power cycles can be categorized as gas cycles and vapor cycles. In gas cycles, a working fluid remains in a gas phase throughout an entire cycle. In vapor cycles, a working fluid exits as vapor phase during one part of a cycle and as liquid phase during another part of the cycle.

Steam power plants run vapor power cycles with water as the working fluid. The vapor power cycle is often referred to as a "Rankine cycle."

As shown in FIG. 1, an exemplary vapor power plant 10, which can generate electrical power by using fuels such as coal, oil or natural gas, includes a subsystem 12, subsystem 14, subsystem 16, and subsystem 18. Subsystem 12 involves energy conversion from heat to work and subsystem 14 involves an energy source required to vaporize the fluid, e.g., water. Subsystem 16 is an electric generator 20 and subsystem 18 is a cooling water system 22. The thermodynamic cycle in FIG. 1 is called the Rankine cycle.

Figure 2:
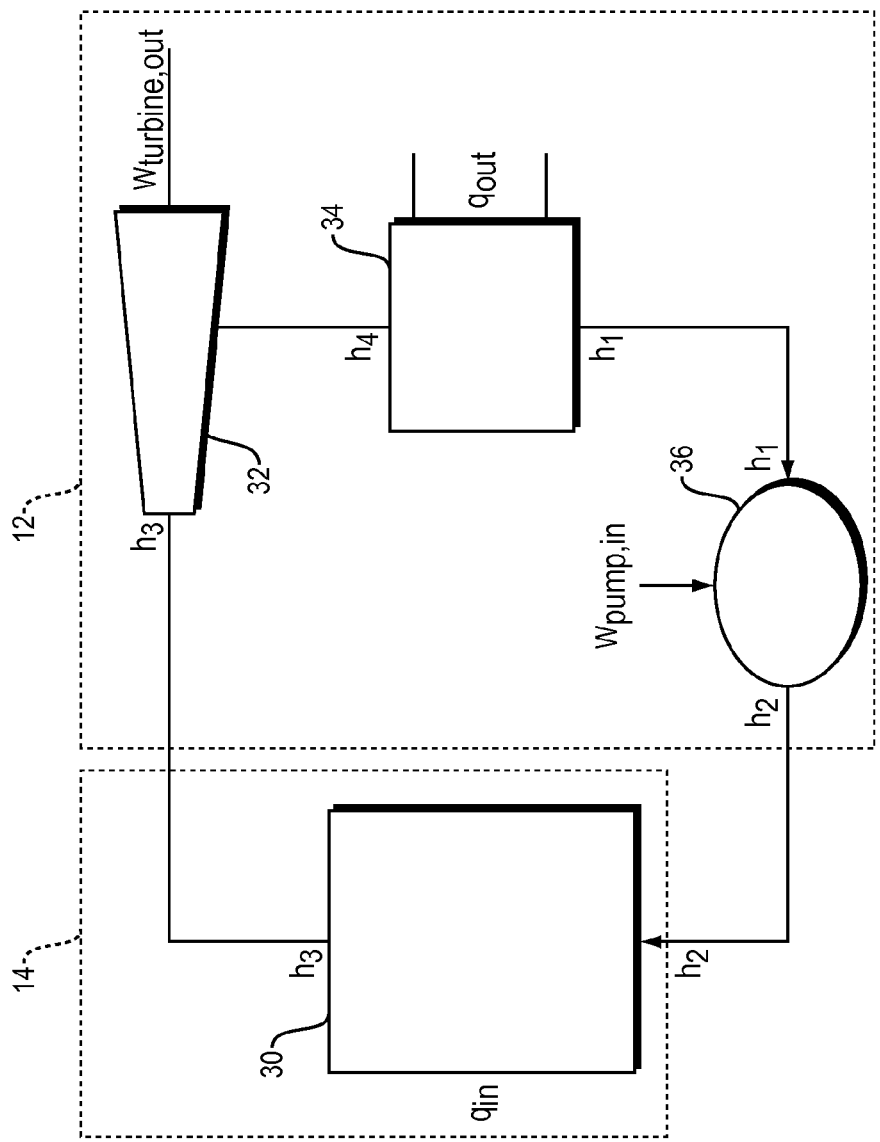
FIG. 2 is a block diagram of an exemplary power generation system.

As shown in FIG. 2, subsystems 12 and 14 include a boiler 30, a turbine 32, a condenser 34 and a pump 36. Fuel, burned in the boiler 30, heats water to generate steam (i.e., subsystem 14 of FIG. 1). This steam is used to run the turbine 32 that powers the generator 20 (subsystem 16 of FIG. 1). Electrical energy is generated when the generator windings rotate in a magnetic field (subsystem 16 of FIG. 1). After the steam leaves the turbine 32, it is cooled to its liquid state in the condenser 34 by transferring heat to the cooling water system 22 (subsystem 18 of FIG. 1). The liquid is pressurized by a pump 36 prior to going back to the boiler 30.

The four components 30, 32, 34 and 36 associated with the Rankine cycle are steady-flow devices and can be analyzed as steady-flow process. The kinetic and potential energy changes of water are small relative to the heat and work terms, and thus neglected.

The pump 36 pressurizes the liquid water from the condenser 34 prior to going back to the boiler 30. Assuming no heat transfer with the surroundings, the energy balance in the pump 36 is:

$$w_{pump,in} = h_2 - h_1$$

Liquid water enters the boiler 30 and is heated to a superheated state in the boiler 30. The energy balance in the boiler 30 is:

$$q_{in} = h_3 - h_2$$

Steam from the boiler 30, which has an elevated temperature and pressure, expands through the turbine 32 to produce work and then is discharged to the condenser 34 with relatively low pressure. Neglecting heat transfer with the surroundings, the energy balance in the turbine 32 is:

$$w_{turbine,out} = h_3 - h_4$$

Steam from the turbine 32 is condensed to liquid water in the condenser 34. The energy balance in the condenser 34 is:

$$q_{out} = h_4 - h_1$$

For the entire cycle, the energy balance can be obtained by summarizing the four energy equations above, which yield:

$$(q_{in} - q_{out}) - (w_{turbine,out} - w_{pump,in}) = 0$$

The thermal efficiency of the Rankine cycle is determined from:

$$\eta_{th} = w_{net,out}/q_{in} = 1 - q_{out}/q_{in}$$

where the net work output from the cycle is:

$$w_{net,out} = w_{turbine,out} - w_{pump,in}$$

The net work output may be drastically improved with the addition of a thermoelectric (TE) generator. In general, a TE generator is a semiconductor-based electronic component that converts heat (temperature differences) into electrical energy using a phenomenon called the "Seebeck Effect." A TE generator generally includes two or more elements of n- and p-type doped semiconductor material that are connected electrically in series and thermally in parallel. These thermoelectric elements and their electrical interconnects typically are mounted between two ceramic substrates. The substrates hold the overall structure together mechanically and electrically insulate the individual elements from one another and from external mounting surfaces. Examples of thermoelectric materials that may be used include, but are not limited to, bismuth telluride, lead telluride, and silicon-germanium.

Figure 3:
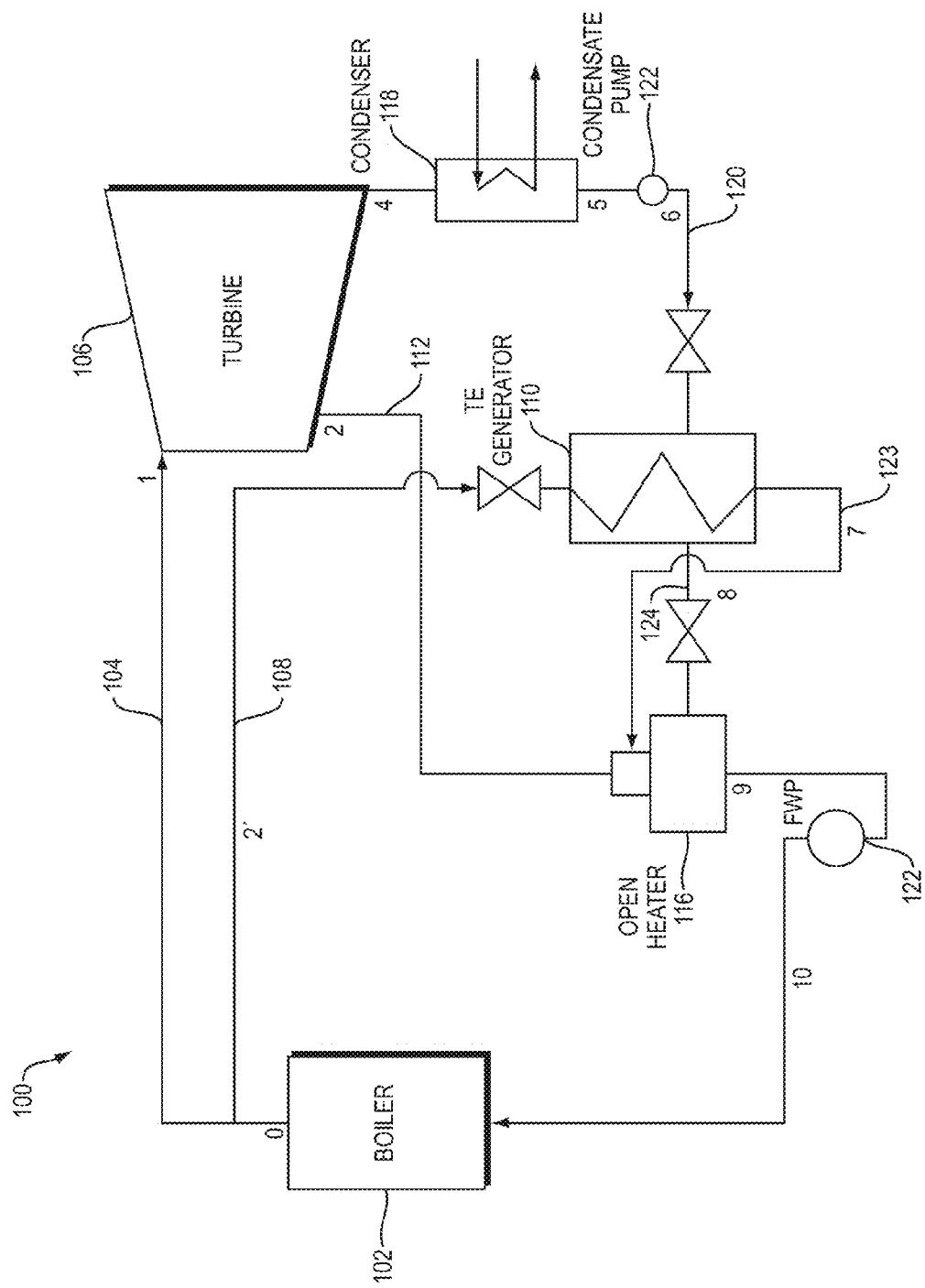
FIG. 3 is a block diagram of one embodiment of the present invention.

As shown in FIG. 3, a first exemplary electric power generation system 100 includes a boiler 102. Fluid within the boiler 102 is heated, and steam exits through an output line 104 to a turbine 106 and as a hot fluid through an output line 108 to a thermoelectric (TE) generator 110, sometimes referred to as a TE unit. The TE generator 110 may include one or more thermoelectric generators or other thermoelectric modules and thus when referred to herein, the TE generator 110 need not consist solely of a single TE generator or module. Example hot fluids include hot water, steam, superheated steam, and so forth. Although FIG. 3 shows a single output line exiting the boiler which splits into a turbine input line 104 linked to the turbine 106 and a TE generator input line 108 linked to the TE generator, alternatively the lines 104 and 108 may be implemented as lines that exit the boiler 102 separately. Steam entering the turbine 106 causes elements within the turbine 106 to rotate.

Extractor 112 extracts steam from the turbine 106, which is fed into an open heater 116, enabling steam from the extractor 112 to mix with and heat feed water with the intent of increasing an overall system efficiency. Although one extractor 112 is shown in FIG. 3 for purposes of example, the system 100 may include any number of extractors, such as one, three, or more extractors. Fluid heated by the open heater 116 is outputted to a pump 122, which feeds the heated feed water back into the boiler 102.

Steam and some condensate exiting the turbine 106 also enters a condenser 118, where it is condensed at a constant pressure and temperature to become a liquid. A condenser output line 120 provides condensed fluid to the TE generator 110.

A temperature difference in the TE generator 110 created by hot fluid from the boiler 102 through output line 108 and condensate from the condenser 118 flowing through condenser output line 120 results in the generation of electric power through the Seebeck Effect.

An exhaust of hot fluid from a hot side of the TE generator 110 through output line 123 to open heater 116 and exhaust of condensate on a cold side of the TE generator 110 through output line 124 to the open heater 116 captures heat not converted directly to electricity in the TE generator 110, thus enabling the heat to be recycled and reutilized.

Other implementations may include, for example, any one or more of flow control and pressure control valves, closed heaters, deaerators, flash tanks, heat exchangers, desuperheaters, pumps, flow restrictors, reheaters, and so forth.

The thermal efficiency of a thermoelectric module in a TE unit can be defined as the percentage of heat entering the thermoelectric module that is actually converted directly to electricity. Therefore a thermal efficiency of 6% means that 6% of the heat flux at the hot surface of the thermoelectric module is converted directly to electricity. The balance of 94% is transferred to the cold medium. The Thermal efficiency of a BiTe thermoelectric generator is generally low, less than 6%, because heat rejected by the generator to the cold medium is considered to be irreversibly lost. Embodiments of the present invention place the thermoelectric generator 110 in a Rankine Cycle such that heat rejected by the thermoelectric generator 110 is not lost but returned to the boiler 102 and where the role of the boiler 102 is to replace the energy converted to electric power in both the TE generator 110 and the turbine generator 106 and replace any thermal energy lost to the environment. The resulting thermal efficiency of the subsystem within the Rankine Cycle of the TE generator 110 coupled with that proportion of the boiler 102 that replaces heat converted to electricity in the TE generator 110 is effectively near 100%. Embodiments of the present invention, therefore, provide a significant positive impact on overall system efficiency, fuel consumption, stack emissions, and waste heat.

Implementations of using hot fluid to feed the TE generator 110 can be adapted for use in all types of power plants, including gas turbine power plants, fossil fired steam power plants (e.g., coal, natural gas, and oil), nuclear power plants (e.g., boiling water reactor (BWR) and pressurized water reactor (PWR)), combined cycle power plants, co-generation power plants, integrated gasification combined cycle (IGCC) power plants, and so forth.

Extraction of hot fluid used to feed the TE generator 110 can originate from any one or more or multiple locations within the overall system 100. For example, in power plants with a furnace/boiler arrangement (e.g., fossil fired steam power plants), hot fluid may be obtained from a reheater, steam exhausted from the high pressure turbine prior to entering the reheater, main steam (superheated) flowing to a HP Turbine, steam leaving a steam drum before entering the superheater, steam from the steam drum, steam leaving the reheater before entering the IP turbine, steam leaving a reheater before entering the LP turbine, hot feed water before entering the boiler, hot water leaving the economizer, hot water from the steam drum, and so forth.

In power plants with a heat recovery steam generator (or boiler), hot fluid may be obtained from a reheater, feed water entering a low pressure economizer, feed water leaving the low pressure economizer, steam leaving a low pressure evaporator, steam vented to atmosphere, feed water entering a high pressure economizer, feed water leaving the high pressure economizer, steam leaving a high pressure evaporator, steam leaving a superheater, steam leaving a desuperheater, and so forth.

In nuclear power plants (e.g., boiling water reactors and pressurized water reactors), hot fluid can be obtained from main steam out of a boiling water reactor before entering a high pressure turbine, main steam out of a steam generator before entering a high pressure turbine on a pressurized water reactor, and so forth.

Equipment used between a point of extraction and the TE generator 110 to regulate temperature, flow, pressure or steam quality can include a flash tank, a heat exchanger, a desuperheater, a flow control valve, a pressure regulating valve, a pump, one or more flow restrictors, one or more reheaters, and so forth.

Figure 4:
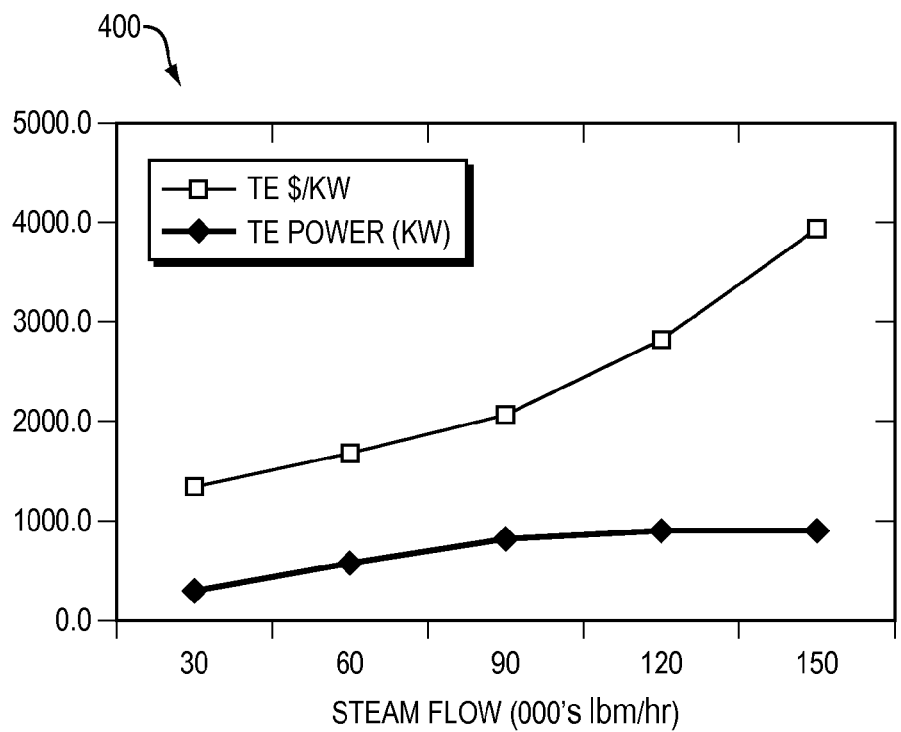
FIG. 4 is an exemplary chart illustrating thermoelectric module cost and power output as a function of steam flow.

As shown in FIG. 4, a chart 400 illustrates the relationship between a cost of the thermoelectric modules in a TE generator and steam flow to a TE unit for a 46 MW plant, assuming thermoelectric modules are purchased at $2.00 per watt. Also shown is the electric power produced by the TE unit as a function of steam flow. For a 46 MW power plant with total steam flow to the turbine at 350,000 lbm per hour, at 90,000 lbm per hour of steam flow to the TE unit, the turbine produces almost 780 KW and the thermoelectric modules of the TE unit cost $2,000/KW.

Figure 5:
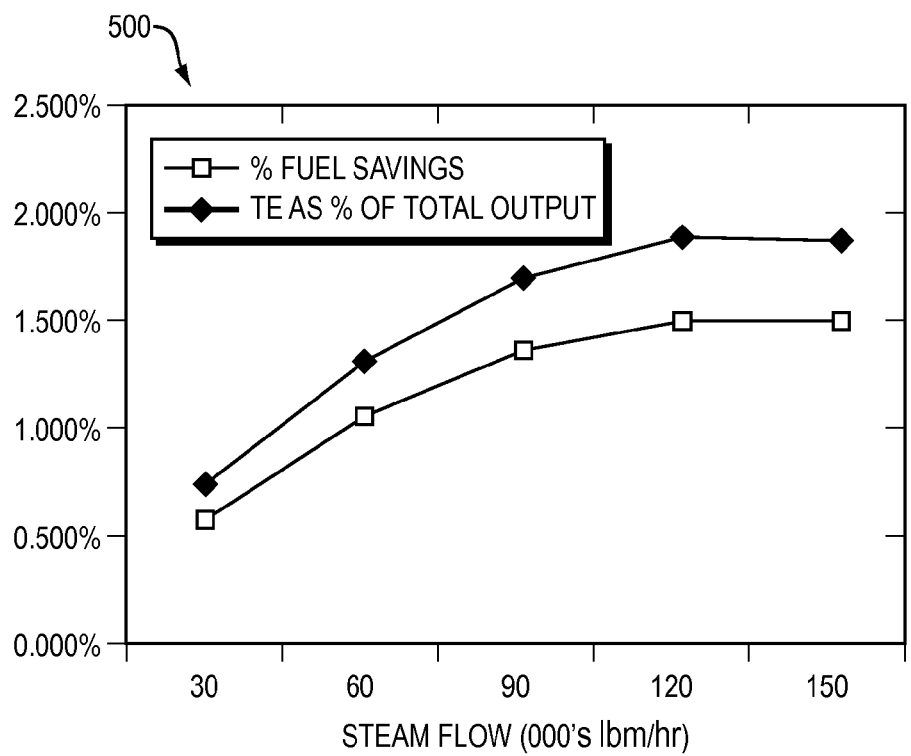
FIG. 5 is an exemplary chart illustrating an estimate of a performance improvement achievable using one embodiment of the present invention.

As shown in FIG. 5, a chart 500 illustrates the benefits to a TE unit integrated into a power plant where power produced by the TE unit is offset by an equivalent reduction in turbine generator output and total plant output remains unchanged.

At 90,000 lbm per hour of steam flow to the TE unit, the TE unit produces 780 KW or approximately 1.7% of a total plant output. Thus, benefits to the plant include total fuel savings of 1.3%, a reduction in waste heat flowing from a condenser to a cooling tower of 2%, and an overall plant efficiency gain of almost 0.5%.

What is also illustrated in FIG. 4 and FIG. 5 is a point of diminishing return for both steam flow to the TE unit as well as for the size of the TE unit for a given plant. This limitation is related to the fixed rate of condensate flow from the condenser and the resulting decline in a mean temperature difference between hot and cold fluids in the TE unit and resulting lower conversion efficiency of a thermoelectric module in a TE unit as steam flow (hot side) to the TE unit is increased without a corresponding increase in condensate flow.

Figure 6:
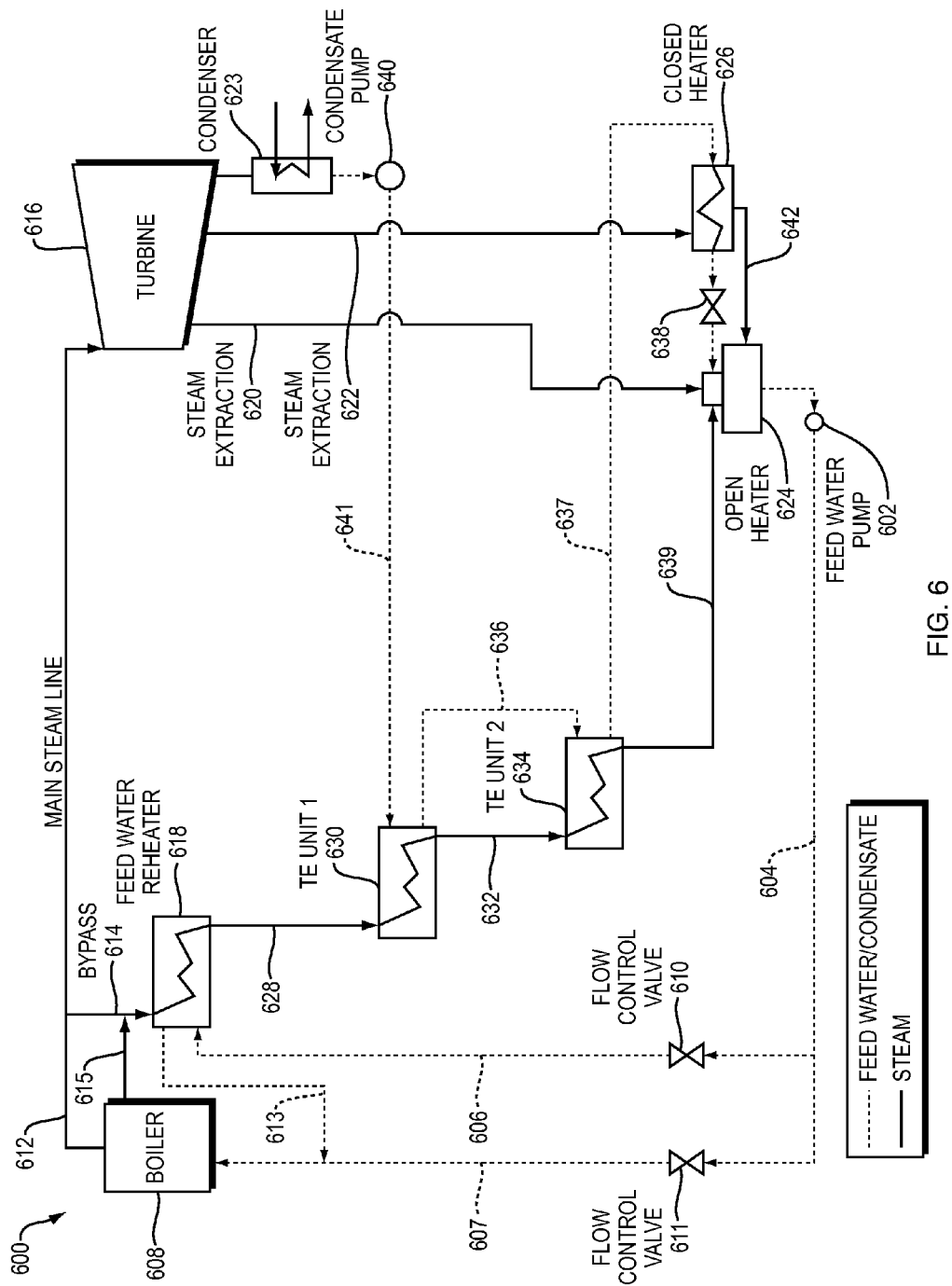
FIG. 6 is a block diagram of another embodiment of the present invention.

As shown in FIG. 6, a second exemplary electric power generation system 600, where solid flow lines indicate hot fluid and dashed flow lines indicate cold fluid, includes a feed water pump 602 connected to a cold fluid line 604 that includes a line 606 to a feed water reheater 618 and a bypass 607. As used herein, the term "reheater" may refer to any kind of heat exchanger. The bypass 607 enables flow of feed water to a boiler 608 and flow control valve 611. The line 606 enables flow of feed water to the feed water reheater 618 and flow control valve 610. A boiler 608 heats cold fluid to generate hot fluid, such as, for example, hot water, saturated steam, or superheated steam. A main hot fluid line 612 exiting the boiler 608 includes a bypass 614. The main hot fluid line 612 enables steam to flow into a turbine 616 and the bypass 614 to the feed water reheater 618. A dry vapor (e.g., steam) expands through the turbine 616, generating power. This decreases the temperature and pressure of the vapor, and some condensation may occur.

Hot fluid flows from the boiler 608 through output lines 612 and 614 or 615 to the feed water reheater 618. Hot fluid from the feed water reheater 618 then flows through output line 628 to a hot side of a TE unit 630. Hot fluid exhausted by the hot side of TE unit 630 flows to a hot side of TE unit 634 through output line 632. Hot fluid exhausted by the hot side of TE unit 634 632 flows to an open heater 624 through output line 639.

Hot fluid exhausted by the turbine 616 enters a condenser 623, where it is condensed at a constant pressure and temperature to become a saturated liquid. The pressure and temperature of the condenser 623 are fixed by a temperature of cooling coils within the condenser 623 as the fluid is undergoing a phase-change.

Condensate from the condenser 623 is pumped by a condensate pump 640 to a cold side of TE unit 630 through output line 641. Condensate exhausted from the cold side of TE unit 630 flows through output line 636 to a cold side of TE unit 634. Condensate exhausted from the cold side of TE unit 634 flows to a closed heater 626 through output line 637. Alternatively, the cold fluid may flow from unit 634 to unit 630, even while the hot fluid flows from unit 630 to unit 634.

TE Unit 630 uses a temperature difference between the high temperature fluid entering though line 628 and exhausting though output line 632 and the relatively colder fluid entering though line 641 and exhausting through line 636 to produce electric energy through the Seebeck Effect.

TE unit 634 uses the temperature difference between the high temperature fluid entering though line 632 and exhausting though output line 639 and the relatively colder fluid entering though line 636 and exhausting through line 637 to produce electric energy through the Seebeck Effect.

Condensate flowing though the cold side of TE unit 630 and TE unit 634 is heated by a thermal energy flowing from the hot side fluid and not converted to electric energy through the Seebeck Effect.

Condensate entering the closed heater 626 is further heated by steam extracted 622 from the turbine 616. Condensate then flows to the open heater 624 through output line 638 where it mixes with hot fluids exhausted from TE unit 634 and is further heated by steam extractor 620 from the turbine 616.

Line 642 enables the flow of hot fluid extracted 622 from the turbine 616 to heat condensate in the closed heater 626 to flow to the open heater 624.

Feed water collected in the open heater 624 is pumped to the boiler 608 and feed water reheater 618 by the feed water pump 602.

Multiple steam extractors 620, 622 extract hot fluid from the turbine 616 and enable the extracted hot fluid to enter the open heater 624 and the closed heater 626, respectively.

Design of the systems described herein increases power plant efficiency, electric power output, fuel efficiency, reduces waste heat produced and gas emissions in relation to a conventional power plant. This is achieved using the thermal energy of hot fluid produced by the boiler on the hot side and condensate and/or makeup feed fluid on the cold side and recapturing (e.g., in open or closed heaters) any thermal energy not converted to electric energy in the TE generator.

The foregoing description does not represent an exhaustive list of all possible implementations consistent with this disclosure or of all possible variations of the implementations described. A number of implementations have been described. Nevertheless, it will be understood that various modifications may be made without departing from the spirit and scope of the systems, devices, methods and techniques described here. For example, various forms of the flows shown above may be used, with steps re-ordered, added, or removed. Accordingly, other implementations are within the scope of the following claims.

What is claimed is:

1. A system comprising: a conventional boiler for heating a fluid, the boiler directing a first portion of the heated fluid through a line to a turbine for the generation of electric power and a second portion of the heated fluid through a separate line to a generator; and a condenser connected to the turbine that condenses hot fluid emitted from the turbine and feeds the condensed fluid to the generator, the generator generating electric power from a difference in temperature of the second portion of the heated fluid and the condensed fluid from the turbine, wherein the generator does not receive fluid directly exhausted from the turbine.

2. The system of claim 1 further comprising an open heater, the open heater receiving exhaust of fluids through a line connecting the open heater to the high temperature side of the generator and through a line connecting the open heater to the low temperature side of the generator, enabling the fluids to mix and capture any thermal energy not converted directly to electric energy in the generator and storing the thermal energy in feed water pumped back into the boiler.

3. The system of claim 2 further comprising a steam drum.

4. The system of claim 3 wherein hot fluid extracted from the steam drum is fed to the generator.

5. The system of claim 2 wherein a hot fluid extraction point feeds hot fluid to the generator.

6. The system of claim 5 wherein the hot fluid extraction point is selected from the group consisting of steam exhausted from the turbine prior to entering the open heater, hot fluid flowing to the turbine, hot fluid from a steam drum, hot fluid leaving the open heater before entering the turbine, and hot fluid before entering the boiler.

7. The system of claim 5 wherein the hot fluid extraction point is selected from the group consisting of hot fluid extracted from a low pressure economizer, hot fluid leaving the low pressure economizer, hot fluid leaving a low pressure evaporator, hot fluid entering a high pressure economizer, fluid leaving the high pressure economizer, hot fluid leaving a high pressure evaporator, hot fluid leaving a superheater, hot fluid leaving a desuperheater, and hot fluid vented to the atmosphere.

8. The system of claim 5 wherein the hot fluid extraction point is selected from the group consisting of hot fluid extracted from a boiling water reactor before entering the turbine, and hot fluid from a steam generator before entering the turbine.

9. The system of claim 5 wherein a device is located between the hot fluid extraction point and the generator to regulate temperature, flow, pressure or steam quality, the device selected from the group consisting of a flash tank, a heat exchanger, a desuperheater, a flow control valve, a pressure regulating valve, a pump, one or more flow restrictors, and one or more reheaters.

10. The system of claim 2 further comprising a condensate pump in a line between the condenser and the generator.

11. The system of claim 2 further comprising a feed water pump in a line between the open heater and the boiler.

12. The system of claim 2 further comprising a superheater.

13. The system of claim 2 further comprising an economizer.

14. The system of claim 2 further comprising a bypass directing the second portion of the heated fluid to the generator.

15. The system of claim 1 wherein the heated fluid is selected from the group consisting of hot water, steam, and superheated steam.

16. The system of claim 1, wherein the generator comprises a thermoelectric (TE) generator.

17. A method comprising:
in a system comprising a boiler linked to both a turbine and a generator and a condenser linked to both the turbine and the generator, sending a boiler generated hot fluid from the boiler to the generator and sending a condenser generated cold fluid from the turbine and condenser to the generator, and generating electric power from a difference between the temperature of the boiler generated hot fluid and a temperature of the turbine generated cold fluid, wherein fluid is not sent directly from the turbine to the generator.

18. The method of claim 17 further comprising:
sending hot fluid exhausted from the generator and cold fluid exhausted from the generator to an open heater; and sending an open heater generated hot fluid to the boiler.

19. The method of claim 17 further comprising sending fluids exhausted from a hot side of the generator and fluids exhausted from a cold side of the generator to an open heater to recapture and store any unused energy flowing through the generator in feed water pumped back to the boiler.

20. The method of claim 17 wherein the boiler generated hot fluid is selected from the group consisting of hot water, steam and superheated steam.

21. The method of claim 17, wherein the generator comprises a thermoelectric (TE) generator.

* * * * *